United States Patent [19]

Augustin et al.

[11] Patent Number: 5,075,625

[45] Date of Patent: Dec. 24, 1991

[54] PROCEDURE AND DEVICE FOR THE DETECTION OF INVERSIONS OF THE EARTH'S MAGNETIC FIELD BY MEANS OF MEASUREMENT TAKEN IN A DRILL SHAFT

[75] Inventors: Antoine Augustin, Grenoble; Jacques Pocachard, Voreppe; Patrick Bouisset, Paris, all of France

[73] Assignee: Total Compagnie Francaise des Petroles, Paris, France

[21] Appl. No.: 594,798

[22] Filed: Oct. 9, 1990

[30] Foreign Application Priority Data

Oct. 10, 1989 [FR] France ................ 89 13199

[51] Int. Cl.$^5$ .................. G01V 3/26; G01V 3/38; G01V 3/40
[52] U.S. Cl. .................. 324/346; 364/422
[58] Field of Search .............. 324/303, 346; 364/422

[56] References Cited

U.S. PATENT DOCUMENTS

| | | | |
|---|---|---|---|
| 2,291,692 | 8/1942 | Cloud | 324/346 |
| 3,391,335 | 7/1968 | Patton et al. | 324/346 |
| 3,402,348 | 9/1968 | Hoehn, Jr. et al. | 324/346 |
| 3,453,531 | 7/1969 | Warren | 324/346 |
| 3,965,412 | 6/1976 | Yungul | 324/346 |
| 4,071,815 | 1/1978 | Zemanek, Jr. | 324/346 |

FOREIGN PATENT DOCUMENTS 2158950 11/1985 United Kingdom .

*Primary Examiner*—Gerard R. Strecker
*Attorney, Agent, or Firm*—Sughrue, Mion, Zinn, Macpeak & Seas

[57] ABSTRACT

A method and device for detecting inversions of the earth's magnetic field by taking measurements in a drill shaft. The device includes a first probe used to measure the magnetic induction $B_1$ during its movement in the shaft, a sensor to measure magnetic induction $B_2$ on the surface of the ground at a stationary point at the same time as $B_1$ is measured, a second probe to measure magnetic susceptibility X of the rocks as it moves through the shaft, and a data-recording and data-processing unit. The data-recording and data-processing unit further includes a device for calculating a value of $B_1-B_2$, filtering the calculated value to isolate the induction fraction $B_L$, which is only composed of a component $B_I$ resulting from an induced magnetization, and the component $B_R$ resulting from the residual magnetization. The induction $B_I$ based on the induction $B_1$ in the shaft and on the magnetic susceptibility X can be calculated.

5 Claims, 4 Drawing Sheets

DATA RECORDING AND PROCESSING UNIT

PROCEDURE AND DEVICE FOR THE DETECTION OF INVERSIONS OF THE EARTH'S MAGNETIC FIELD BY MEANS OF MEASUREMENT TAKEN IN A DRILL SHAFT

The present invention concerns a procedure making it possible to determine the residual magnetization of rocks through which a shaft is drilled, in order to locate the zones of inversion of the earth's magnetic field.

The earth's magnetic field is now oriented northward; however, over the course of geological time, it very often swung between the north and the south. Rocks possess a magnetization which may be separated into two terms: one portion, induced by the earth's magnetic field, is called induced magnetization; the other part corresponds to the storage of the earth's magnetic field as it existed when the rocks were deposited and/or formed, and it lies in the direction of this terrestrial magnetic field. This latter fraction is called residual magnetization. It may be supposed that the inversions of the direction of residual magnetization found during drilling in successive rock layers faithfully mirrors the inversions of the terrestrial magnetic field produced between the epochs during which the layers were deposited.

The detection of inversions thus makes it possible to date the rocks. In the field of oil well drilling, knowledge of the age of the rocks is of the highest importance, since it allows a correlation to be established among the layers.

Procedures for the detection of inversions of the earth's magnetic field are already known. The most widely-used procedure consists in taking multiple samples of rocks along the drill shaft, bringing them up to the surface, and conducting a magnetic analysis in the laboratory in order to determine their residual magnetization. However, this procedure is long and expensive; once brought to the surface, moreover, the samples acquire an interference magnetization due to the influence of terrestrial magnetization and of temperature change.

For this reason, an entire family of magnetic measurement probes was created in the past, called magnetometers or magnetoradiometers, which make it possible to determine at the actual site the magnetization of the rocks as the probe moves through the drill shaft, this probe being connected to a data-processing unit installed on the surface.

Examples of such probes are described in Patents GB-A-2 158 950, U.S. Pat. No. 3,453,531, and U.S. Pat. No. 3,965,412. When working on highly magnetized rocks, the induction created in the well by residual magnetization is sufficiently pronounced to be detected directly. However, with respect to oil drilling, the rocks exposed to the probe have a very low degree of magnetization, with only rare exceptions. Now, the value of the magnetic induction must be known with a high degree of precision. Since the inductions involved range approximately from 1 to 10 nanoTeslas (nT), it is desirable that they be known with an accuracy of less than 1 nT.

Very precise tri-axial magnetometers are known which make it possible to determine magnetic induction by reconstruction based on the three components. However, the lack of precision permitted by this technique makes the operation difficult in the area of oil drilling. This lack of precision is not linked to the intrinsic features of the magnetometer, but rather to the detection procedure.

U.S. Pat. No. 4,071,815 disclosed a procedure for the detection of inversions of the magnetic field, which consists in conducting two simultaneous measurements of the total magnetic field $B_1$ and $B_2$ in the drill shaft at two separate points, and two measurements of the terrestrial magnetic susceptibility $X_1$ and $X_2$ at the same points; in calculating the difference $B=B_1-B_2$ and the difference $X=X_1-X_2$; and finally, in calculating the value $R=$ Difference $B-$ Difference $X$, which is representative of the fraction of residual magnetization present in the rock at these two points.

This known procedure is useful, but it suffers from a lack of optimization which would make it possible to exploit the value R which, as indicated above, contains only a fraction of the information pertaining to residual magnetization.

The purpose of the present invention is to overcome the disadvantages of the procedures belonging to prior art, described above. The invention pertains to a procedure for the reading of measurements of the magnetic field in a drilling well, and for the processing of these measurements so as to determine, in concrete fashion, the zones of inverted and normal polarity through which the drill shaft passes. A zone of normal polarity is one in which the residual magnetization in the rock is oriented in the same direction as the present-day terrestrial magnetic field; inversely, in a zone of inverted polarity, the residual magnetization of the rock is out of phase by 180° in relation to the present-day terrestrial magnetic field.

The procedure according to the invention is characterized by the fact that it consists in:

measuring the variations in the terrestrial magnetic induction $B_1$ at a large number of points along the entire length of the drill shaft by continuously bringing to the surface a measuring apparatus and, simultaneously, measuring the variations in the magnetic induction $B_2$ at a fixed point on the surface of the ground, as well as the variations in the magnetic susceptibility X of the rocks at a large number of sites along the entire length of the drill shaft, by bringing the measurement apparatus continuously to the surface;

determining the value of $B_1-B_2$, in order to eliminate the influences of the temporal variations in the terrestrial magnetic field on the magnetic induction $B_1$ measured in the shaft;

filtering said quantity, in order to eliminate the induction fraction resulting from distant magnetic sources, and thus to isolate the remaining induction fraction $B_L$, which comprises a component $B_I$ resulting from induced magnetization and a component $B_R$ resulting from residual magnetization;

calculating the induction $B_I$ based on the measurements of the induction $B_1$ and of the magnetic susceptibility X;

and finally, calculating, based on the inductions $B_L$ and $B_I$ thus obtained, the influence of the changes of orientation of the residual magnetization.

The invention also pertains to a device making it possible to effect the processing of the data obtained concerning the inductions $B_L$ and $B_I$, in order to calculate the direction of the residual magnetization.

The method for detecting inversions of residual magnetization will now be explained in more detail in the following description, made with reference to the attached drawings in which:

FIG. 1 shows, in one diagram, examples of curves corresponding to variations in the induction $B_L$ and in the induction $B_I$ as function of depth z;

FIGS. 2a, 2b, and 2c illustrate a first procedure for the detection of the inversions of the residual induction by the transposition of each peak of the $B_I$ induction curve in FIG. 1, so as to superimpose it over the corresponding peak of the induction $B_L$;

As explained above, measurement is made, first, of the terrestrial magnetic induction $B_1$ and of magnetic susceptibility X along the drill shaft, and second, the magnetic induction $B_2$ at surface level.

It is known that the induction $B_1$ takes the form:

$$B_1 = B_O + B_L + B_T$$

where $B_O$ is the induction linked to distant magnetic influences;

$B_L$ is the induction linked to proximate magnetic influences (induced and residual magnetization); and $B_T$ is the induction linked to the temporal variation of the terrestrial magnetic field.

It is obvious that induction $B_2$ at the surface takes the form $B_2 = B_T$, given that the influence of distant and proximate sources is negligible.

The first processing operation at the surface consists of isolating the parameter $B_L$. For this, the following is computed:

$$B_1 - B_2 = B_O + B_L + (B_T - B_T).$$

For rocks possessing low conductivity (which is the case in the field of oil geology), $B_T$ and $B_T$ can be identified without deterioration of results up to a depth of 2,000 meters. Beyond that point, the attenuation produced by the layers lying above it must be considered.

Because of its origins, induction $B_O$ possesses variations of a longer wavelength than induction $B_L$. By filtering appropriately, $B_L$ and $B_O$ can thus be suitably separated. Thus, $B_L$ is made available with a high degree of precision. It will be remembered that the information contained in the quantity $B_L$ pertains to the induced magnetization $B_I$ and partly to residual magnetization $B_R$.

Moreover, using the measurement of $B_1$, the induction $B_I$ created by the induced magnetization of the rocks through which the shaft is drilled can be determined with great accuracy, using the formula:

$$B_I = XB_1 k,$$

where k is the connection factor between X and the induction in the well, which depends on the geometry of the formation and of the well.

Beginning with this stage, two techniques can be applied to detect the residual magnetization inversions; these techniques rely on theoretical and experimental arguments.

Figure 1:
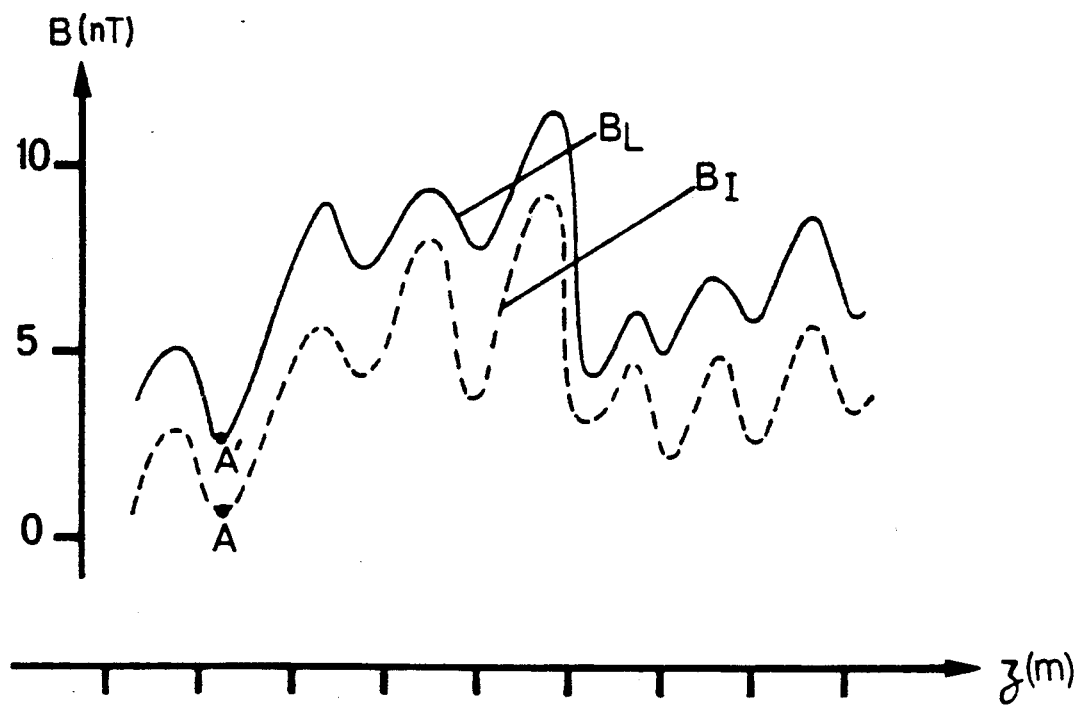

One of these techniques consists in tracing the logging surveys of $B_L$ and $B_I$ (in nT) as a function of the depth z (in meters). FIG. 1 represents an example of these logging surveys. As can be seen, the peaks and valleys of $B_L$ and $B_I$ have a given periodicity (of approximately one meter, for example). A peak is found to correspond to an increase in the magnetization in the formation.

For each of the peaks, point A' where the induction is lowest is taken as the point of origin of the curve $B_L$ and the corresponding point A at the same depth, as the point of origin of curve $B_I$. The cycle of curve $B_I$ is subjected to a displacement AA', thereby causing point A' to coincide with A. Several configurations may then appear, only some examples of which will be considered below with the interpretations resulting for a configuration of the magnetic fields identical to that found in the Parisian Basin. It should be noted that, for other magnetic field configurations encountered in other parts of the globe, interpretations will differ but will be based on the same curve-analysis principle.

Figure 2A:
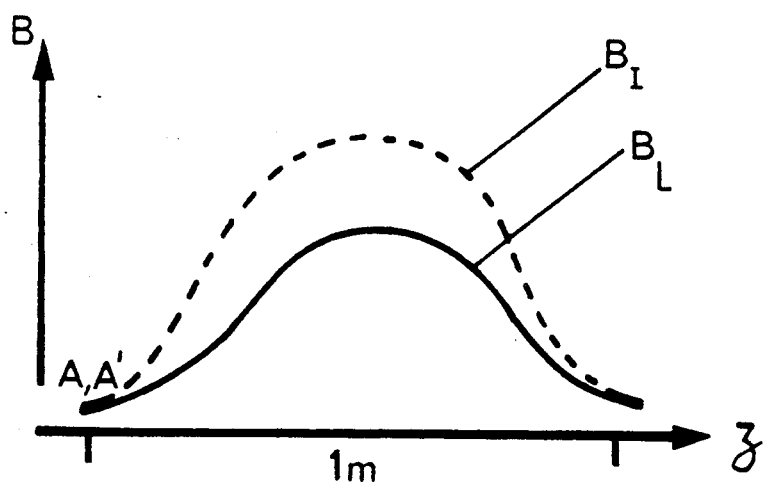

1. The curve $B_I$ lies above curve $B_L$ (FIG. 2a): the increase in $B_I$ is attenuated by $B_R$. The residual part $B_R$ contained in $B_L$ is thus opposed to $B_I$; the residual magnetization in the formation is opposed to the induced magnetization. The residual magnetization is said to be inverted.

Figure 2B:
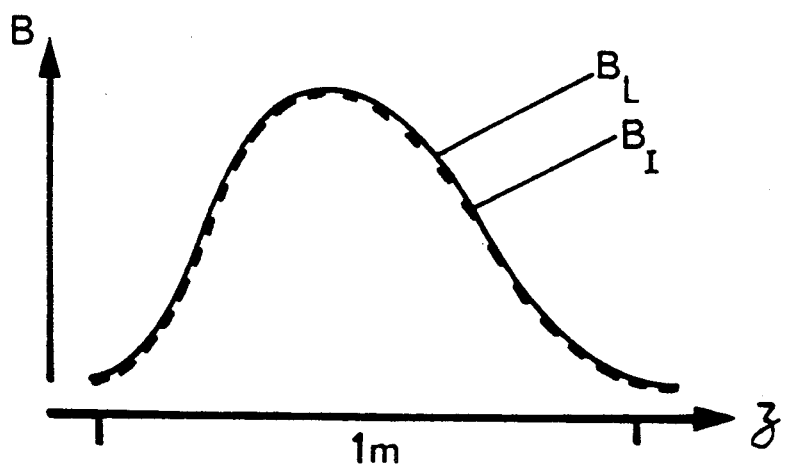

2. Displaced curve $B_I$ merges with curve $B_L$ (FIG. 2b): the direction of $B_R$ is indeterminate.

Figure 2C:
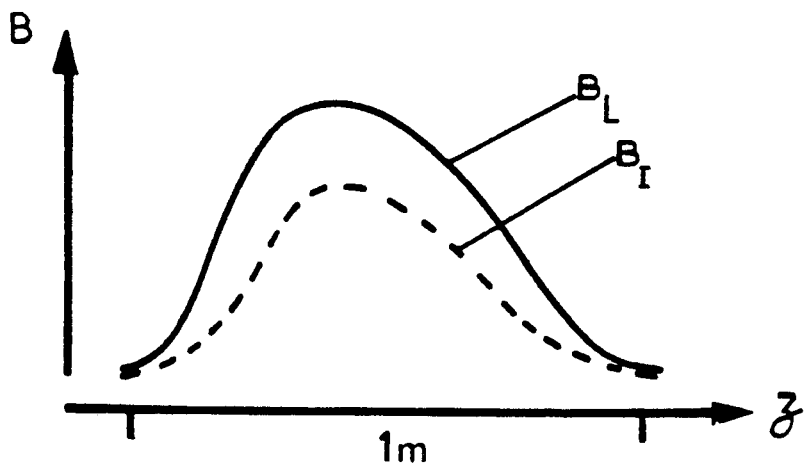

3. Displaced curve $B_I$ lies beneath curve $B_L$ (FIG. 2c), signifying that the increase in $B_I$ is strengthened by $B_R$. As a result, the residual magnetization occurs in the direction of the induced magnetization. The residual magnetization is termed normal.

Figure 3:
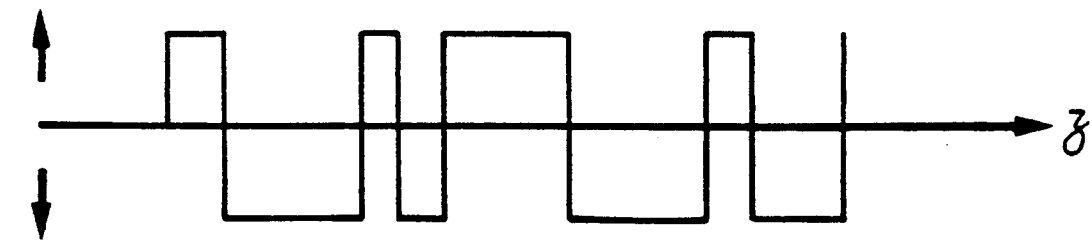
FIG. 3 represents an example of a diagram summarizing the results obtained in the drill shaft.

The same procedure is followed for each peak of the logging surveys $B_L$ and $B_I$. All of the results obtained can thus be summarized in the diagram in FIG. 3, in which the depth z lies along the abscissae and the direction of $B_R$, along the ordinates.

The second technique for detection of inversions of residual induction begins with the induction curves $B_L$ and $B_I$ and consists in calculating the absolute values of the gradients or of the first derivatives:

$$\frac{dB_L}{dz} \text{ and } \frac{dB_I}{dz}$$

for an appropriate base dz. This calculation makes it possible to avoid the large general variations of these inductions resulting from the lithology of the rocks, and pinpoint only localized variations. In this way, two curve profiles $GB_L$ and $GB_i$, as illustrated in FIGS. 4a and 4b, are obtained.

For each of the curves $GB_L$ and $GB_I$, families of curves $L_i$ and $I_i$ are calculated and put in parametric form as a function of the second derivative of $B_L$ and of $B_I$.

Figure 4:
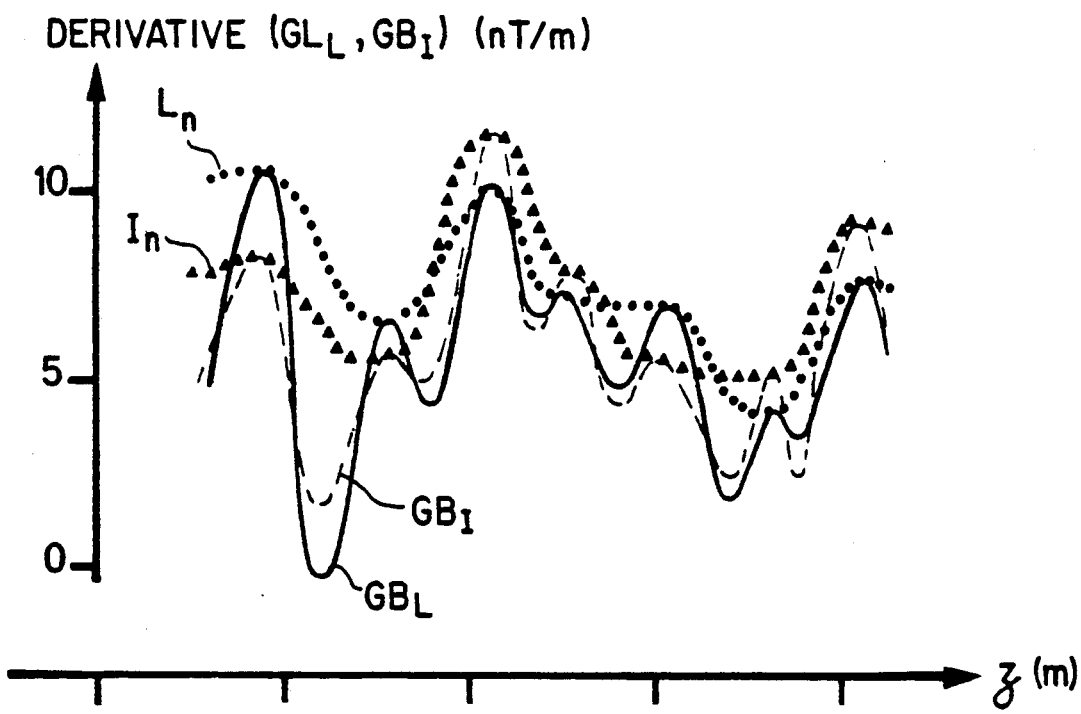
FIGS. 4a and 4b illustrate a second procedure for detecting inversions of the residual induction by calculating the derivative of the inductions $B_L$ and $B_I$ and by comparing the average slopes of the changes in $B_I$ and $B_L$ on variable depth scales.
Figure 4:
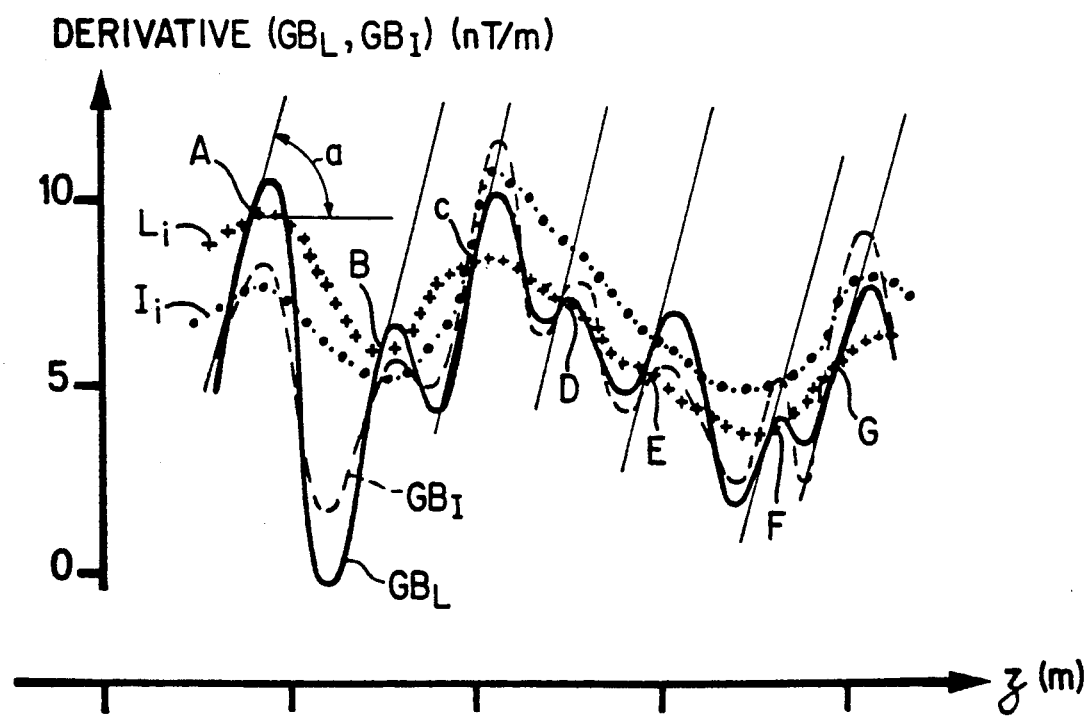

As an example, the upper-limit curve $L_n$ will pass through the maximum values of $GB_L$; curve $I_n$ will pass through the maximum values of $GB_I$ as shown in FIG. 4a. The curves $L_i$ and $I_i$ are then recorded, and the following ratio is calculated, where $K_i$ corresponds to the curves $L_i$ and $I_i$, i.e., the curves passing by the points where $dGB_L/dz = 0$ and $dGB_I/dz = 0$, respectively:

$$K_i = \frac{L_i}{I_i}.$$

As another example, the ratio of the absolute values of the maximum curves is calculated, where $K_n$ corresponds to the curves $L_n$ and $I_n$, i.e., the curves passing by the points where $dGB_L/dz=0$, and $dGB_I/dz=0$, respectively:

$$K_n = \frac{L_n}{I_n}.$$

The value of $K_i$ will be greater or less than 1, according to the relative position of the curves $L_i$ and $I_i$.

In a magnetic configuration identical to that encountered in the Parisian Basin, if $K_i>1$, the residual magnetization is normal (i.e., in the direction of the induced magnetization). In other magnetic configurations encountered on the surface of the globe, the conclusions could be different.

It will be noted that the display of $K_i$ is better when its logarithm is represented. The polarity of $B_R$ is determined as a function of the sign of the log ($K_i$).

Figure 5A:
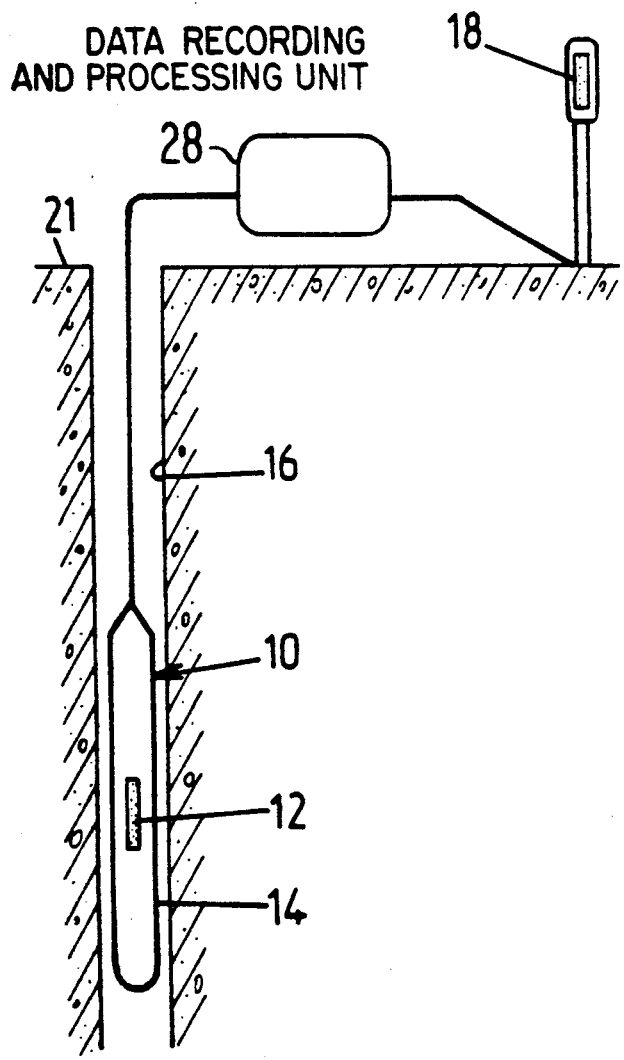
FIGS. 5a and 5b illustrate diagrammatically the measurement apparatuses and their positions.
Figure 5B:
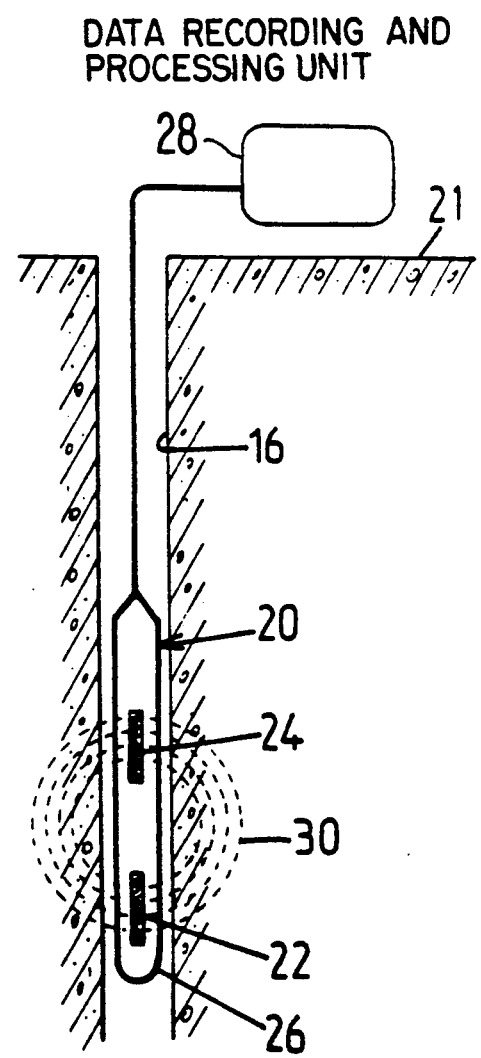

The above-mentioned measurements and calculations are performed by a processing device illustrated schematically in FIGS. 5a and 5b. This device comprises a first probe 10 incorporating a sensor 12, for example, a nuclear magnetic resonance sensor, enclosed in a packing 14 used to measure magnetic induction $B_1$ in the drill shaft 16 as it moves in said shaft; a sensor 18, for example a nuclear magnetic resonance sensor, used to measure the magnetic induction $B_2$ on the surface of the ground 21 at a stationary point at the same time as the measurement of $B_1$ is being made; a second probe 20 comprising a transmitter 22 and a sensor 24 enclosed in a protective envelope 26 and used to measure the magnetic susceptibility of the rocks in the drill shaft during its movement in that shaft; and a data-recording and data-processing unit 28 comprising means for filtering the value $B_1-B_2$ for the purpose of isolating the induction fraction $B_L$ containing only the component $B_I$ resulting from induced magnetization and the component $B_R$ resulting from residual magnetization; and means for calculating the induction $B_I$ based on the induction $B_1$ in the shaft and on the magnetic susceptibility X. In FIG. 5b, dotted lines represent the lines of the magnetic field 30.

To apply the first detection technique described above, the data-recording and data processing unit 28 also includes a device comprising means for tracing curves $B_L$ and $B_I$, means for subjecting each peak of curve $B_I$ to a displacement AA' which causes point A of curve $B_I$ having a lower value to coincide with the corresponding point A' of the curve $B_L$, and means for comparing the relative changes in the curves $B_L$ and $B_I$ positioned in this manner.

To implement the second technique, according to the invention, the data-recording and data processing unit 28 further includes a means for calculating the first derivatives of the inductions $B_L$ and $B_I$, means for tracing the absolute values of the derivated curves $GB_L$ and $GB_I$ as a function of depth (the depth base being capable of variation); means for calculating and tracing the families of curves $L_i$ and $I_i$ and placing the curves $L_i$ and $I_i$ forms as a function of the second derivatives of curves $B_L$ and $B_I$, (at various depths) and means for calculating the ratio:

$$K_i = \frac{L_i}{I_i}.$$

and for studying its value as a function of depth.

We claim:

1. A method for detecting inversions of the earth's magnetic field in a drill shaft, wherein said method comprises the steps of:

measuring variations in the terrestrial magnetic induction $B_1$ at multiple points along an entire length of said drill shaft by continuously bringing to the surface of the earth from one of said multiple points a measuring apparatus and, simultaneously, measuring variations in the magnetic induction $B_2$ at a fixed point on said surface of the earth, measuring variations in the magnetic susceptibility X of rocks at multiple sites along an entire length of said drilling shaft by bringing the said measurement apparatus continuously to the surface of said earth from one of said multiple sites;

determining a value equivalent to $B_1-B_2$, thereby eliminating influences of the temporal variations in the terrestrial magnetic field on the magnetic induction $B_1$ measured in said drill shaft;

filtering said value to eliminate the induction fraction resulting from distant magnetic sources, and thereby isolating the remaining induction fraction $B_L$, said induction fraction $B_L$ comprising a component $B_I$ resulting from induced magnetization and a component $B_R$ resulting from residual magnetization;

calculating the induction $B_I$ based on the measurements of the induction $B_1$ and of the magnetic susceptibility X; and calculating, based on the inductions $B_L$ and $B_I$ thus obtained, the influence of the changes of orientation of the residual magnetization.

2. A device for detecting inversions of the earth's magnetic field in a drill shaft, comprising:

a first probe (10) incorporating a sensor (12) used to measure magnetic induction $B_I$ at multiple points in said drill shaft (16) as said first probe moves in said shaft;

a sensor (18) used to measure magnetic induction $B_2$ on the surface of the ground (21) at a stationary point at the same time as the measurement of $B_1$ is being made;

a second probe (20) used to measure the magnetic susceptibility of the rocks at multiple sites in the drill shaft during movement of said second probe in the hole; and a data-recording and data-processing unit (28) comprising means for calculating a value of $B_1-B_2$; means for filtering said value $B_1-B_2$ for isolating the induction fraction $B_L$ which contains the component $B_I$ resulting from induced magnetization and the component $B_R$ resulting from residual magnetization; means for calculating the induction $B_I$ based on the induction $B_1$ in said shaft and on the magnetic susceptibility X; and means for calculating the influence of orientation of the residual magnetization based on the calculated inductions $B_L$ and $B_I$.

3. The device according to claim 2, wherein the sensors (12, 18) comprise nuclear magnetic resonance sensors.

4. The device according to claim 2, wherein said device further comprises means for tracing curves $B_L$ and $B_I$, means for subjecting each peak of curve $B_I$ to a displacement AA' which causes point A of curve $B_I$ having a lower value to coincide with the corresponding point A' of the curve $B_L$, and means for comparing the relative amplitudes of the corresponding peaks of curves $B_L$ and $B_I$.

5. The device according to claim 2, wherein said device further comprises:
   means for calculating first derivatives of the inductions $B_L$ and $B_I$; means for tracing the curves derived from said inductions as a function of depth, the depth base being variable; means for calculating and tracing the families of the curves $L_1$ and $I_1$ and placing said curves $L_i$ and $I_i$ in parametric form as a function of second derivatives of curves $B_L$ and $B_I$; means for taking the absolute value of said families of curves as a function of depth of said drill shaft and means for calculating the ratio:

$$K_i = \frac{L_i}{I_i}$$

and for analyzing said ratio as said function of depth.

* * * * *

UNITED STATES PATENT AND TRADEMARK OFFICE
CERTIFICATE OF CORRECTION

PATENT NO. : 5,075,625

DATED : December 24, 1991

INVENTOR(S) : Antonie AUGUSTIN et al.

It is certified that error appears in the above-identified patent and that said Letters Patent is hereby corrected as shown below:

<u>TITLE PAGE, ITEM [73]</u>

The Assignees are as follows:

TOTAL COMPAGNIE FRANCAISE DES PETROLES and

COMMISSARIAT A L'ENERGIE ATOMIQUE, C.E.A., both of Paris, France

Signed and Sealed this

Tenth Day of May, 1994

*Attest:*

BRUCE LEHMAN

*Attesting Officer*     *Commissioner of Patents and Trademarks*